United States Patent
Setoguchi

(10) Patent No.: US 8,421,310 B2
(45) Date of Patent: Apr. 16, 2013

(54) MULTI-LAYER PIEZOELECTRIC ELEMENT, EJECTION APPARATUS USING THE SAME AND FUEL EJECTION SYSTEM

(75) Inventor: Tsuyoshi Setoguchi, Kirishima (JP)

(73) Assignee: Kyocera Corporation, Kyoto (JP)

( * ) Notice: Subject to any disclaimer, the term of this patent is extended or adjusted under 35 U.S.C. 154(b) by 482 days.

(21) Appl. No.: 12/671,025

(22) PCT Filed: Sep. 25, 2008

(86) PCT No.: PCT/JP2008/067262
§ 371 (c)(1),
(2), (4) Date: Jun. 15, 2010

(87) PCT Pub. No.: WO2009/041476
PCT Pub. Date: Apr. 2, 2009

(65) Prior Publication Data
US 2010/0276510 A1    Nov. 4, 2010

(30) Foreign Application Priority Data

Sep. 27, 2007 (JP) ................................ 2007-252426
Aug. 27, 2008 (JP) ................................ 2008-217913

(51) Int. Cl.
*H01L 41/083* (2006.01)
(52) U.S. Cl.
USPC .......................................... 310/328; 310/366
(58) Field of Classification Search .................. 310/328, 310/366
See application file for complete search history.

(56) References Cited

U.S. PATENT DOCUMENTS

| 5,758,398 | A | 6/1998 | Rijnbeek et al. |
| 7,414,352 | B2 * | 8/2008 | Nanataki et al. ............... 310/358 |
| 7,498,727 | B2 | 3/2009 | Nakamura et al. ............. 310/366 |
| 7,594,309 | B2 | 9/2009 | Iwase et al. ................... 29/25.35 |
| 7,633,210 | B2 * | 12/2009 | Ono et al. ....................... 310/328 |
| 8,007,903 | B2 | 8/2011 | Okamura et al. |
| 8,288,921 | B2 * | 10/2012 | Terazono et al. .............. 310/328 |

(Continued)

FOREIGN PATENT DOCUMENTS

| EP | 1653527 A1 | 5/2006 |
| JP | 2000-077733 | 3/2000 |

(Continued)

OTHER PUBLICATIONS

Extended European search report dated May 25, 2012 issued in corresponding European application 08833521.1 cites the U.S. patent and foreign patent documents above.

*Primary Examiner* — J. San Martin
(74) *Attorney, Agent, or Firm* — DLA Piper LLP (US)

(57) ABSTRACT

To provide a multi-layer piezoelectric element which is easy to be fabricated and which exhibits excellent durability, even when it is driven continuously for a long time under high electric field and high pressure. The multi-layer piezoelectric element comprising a stacked body wherein a plurality of piezoelectric layers and a plurality of metal layers are stacked alternately one on another and it is driven by applying a voltage to adjacent and opposing metal layers, wherein an average grain size of the piezoelectric crystal grains in a region of the piezoelectric layer, in which region the piezoelectric layer is sandwiched between the adjacent and opposing internal electrode in the stacking direction.

11 Claims, 6 Drawing Sheets

U.S. PATENT DOCUMENTS

| | | | |
|---|---|---|---|
| 2007/0124903 A1 | 6/2007 | Iwase et al. | 29/25.35 |
| 2008/0007143 A1 | 1/2008 | Nakamura et al. | 310/358 |
| 2009/0133238 A1 | 5/2009 | Nakamura et al. | 29/25.35 |
| 2010/0006678 A1* | 1/2010 | Sato | 239/585.1 |
| 2010/0288849 A1* | 11/2010 | Okamura | 239/102.2 |
| 2010/0294853 A1* | 11/2010 | Okamura | 239/102.2 |
| 2010/0320284 A1* | 12/2010 | Okamura | 239/102.2 |
| 2011/0000466 A1* | 1/2011 | Sato | 123/478 |

FOREIGN PATENT DOCUMENTS

| | | |
|---|---|---|
| JP | 2001-156348 | 6/2001 |
| JP | 2005-191050 | 7/2005 |
| JP | 2005-340540 | 12/2005 |
| JP | 2006-321671 | 11/2006 |
| JP | 2006-324361 | 11/2006 |
| JP | 2007-157849 | 6/2007 |
| WO | WO 2007037377 A1 * | 4/2007 |
| WO | 2007097460 A1 | 8/2007 |

* cited by examiner

MULTI-LAYER PIEZOELECTRIC ELEMENT, EJECTION APPARATUS USING THE SAME AND FUEL EJECTION SYSTEM

CROSS-REFERENCE TO THE RELATED APPLICATIONS

This application is a national stage of international application No. PCT/JP2008/067262, filed on Sep. 25, 2008, and claims the benefit of priority under 35 USC 119 to Japanese patent application No. 2007-252426, filed on Sep. 27, 2007 and Japanese patent application No. 2008-217913, filed on Aug. 27, 2008, the entire contents of all of which are incorporated herein by reference.

TECHNICAL FIELD

The present invention relates to a multi-layer piezoelectric element, an ejection apparatus and a fuel ejection system, and more particularly to a multi-layer piezoelectric element, for example, a driving element (piezoelectric actuator) mounted in a fuel ejection apparatus of an automobile engine, a liquid ejection apparatus of an ink jet printer or the like, a precision positioning device for an optical apparatus, a vibration preventing device; a sensor element mounted in a combustion pressure sensor, a knocking sensor, an acceleration sensor, a load sensor, an ultrasound sensor, a pressure sensor, a yaw rate sensor or the like; and circuit component mounted in a piezoelectric gyro, a piezoelectric switch, a piezoelectric transducer, a piezoelectric breaker or the like; to an ejection apparatus using the same and a fuel ejection system.

RELATED ART

Conventionally, the multi-layer piezoelectric element becomes smaller and is required to undergo a greater amount of displacement under a higher pressure. Thus, a construction of a multi-layer piezoelectric element, which can be operated continuously over a longer period of time with an electric field of higher intensity applied thereto, is proposed (refer to, for example, Patent Document 1: Japanese Unexamined Patent Publication (Kokai) No. 2001-156348). The construction disclosed by Patent Document 1 comprises a stack containing internal electrode layers, wherein a stress relaxation layer is disposed each between the internal electrode layers and side faces of the stack. [Patent Document 1] Japanese Unexamined Patent Publication (Kokai) No. 2001-156348

SUMMARY OF THE INVENTION

Problems to be Solved by the Invention

However, the construction disclosed by Patent Document 1 comprises arranging a stress relaxation layer each between the internal electrode layers and side faces of the stack, so that there was a problem that the construction of the multi-layer piezoelectric element comes to be complicated.

Thus, it is an object of the present invention to provide a multi-layer piezoelectric element, which can be easily fabricated and which has an excellent durability even when it would be continuously operated over a long period of time under a high electric field and a high pressure, an ejection apparatus which uses the above element and a fuel ejection system.

Means for Solving the Problems

In order to attain the above object, the multi-layer piezoelectric element of the present invention which comprises a stacked body in which a plurality of piezoelectric layers and a plurality of metal lavers are stacked alternately one on another, wherein the piezoelectric material layer comprises a plurality of piezoelectric crystal grains, wherein an average grain size of the piezoelectric crystal grains in a side face of the stacked body is larger than an average grain size of the piezoelectric crystal grains in a region of the piezoelectric layer, in which region the piezoelectric layer is sandwiched between the adjacent and opposing internal electrode in the stacking direction.

In addition, the ejection apparatus of the present invention comprises a container comprising an ejection hole and the multi-layer piezoelectric element described above housed in the container, wherein liquid is ejected through the ejection hole by the drive of the multi-layer piezoelectric element.

The ejection system of the present invention comprises a common rail for storing a fuel at a high pressure, an ejection apparatus described above for discharging the fuel stored in the common rail, a pump for supplying the fuel at a high pressure to the common rail, and an ejection control unit that supplies a drive signal to the ejection apparatus.

Advantage

According to the multi-layer piezoelectric element of the present invention, which has the simple construction that the average grain size of piezoelectric crystal grains in the side face of the stacked body is larger than that in a region of the piezoelectric laver, in which region the piezoelectric layer is sandwiched between the adjacent and opposing internal electrode in the stacking direction, a stress relaxation effect in the side face of the stacked body is obtained.

Accordingly, the present invention can provide a multi-layer piezoelectric element which is easy to be fabricated and which exhibits excellent durability, even when it is driven continuously for a long time under high electric field and high pressure.

BRIEF DESCRIPTION OF THE DRAWINGS

FIG. 2C is an enlarged schematical sectional view showing Region T3a in FIG. 1B.

BRIEF DESCRIPTION OF REFERENCE NUMERALS

Figure 1A:
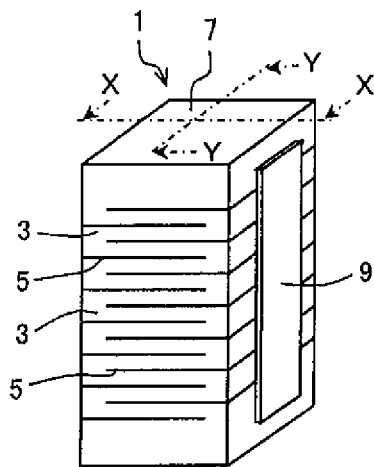
FIG. 1A is a perspective view showing the multi-layer piezoelectric element according to a first embodiment of the present invention.

1 Multi-layer piezoelectric element
3 Piezoelectric layer
5 Internal electrode layer
5B Low-rigidity metal layer
7 Stacked body
9 External electrode
11, 11a, 11b Piezoelectric crystal grains
51 Metal part
52 Void

DETAILED DESCRIPTION OF THE PREFERRED EMBODIMENTS

Hereinafter, the multi-layer piezoelectric element of the embodiments of the present invention will be described in detail with reference to the accompanying drawings.
Embodiment 1

Figure 1B:
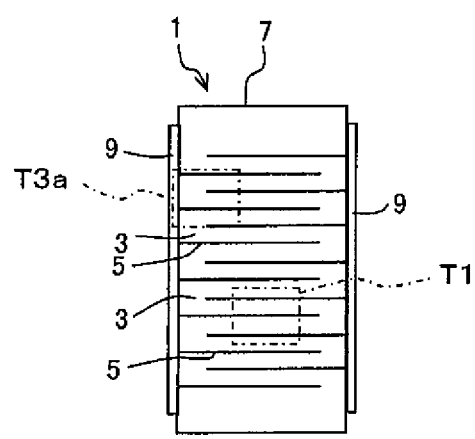
FIG. 1B is a sectional view taken along lines X-X in FIG. 1A.
Figure 1C:
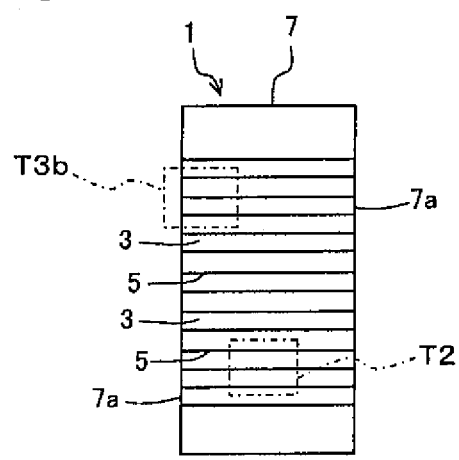
FIG. 1C is a sectional view taken along lines Y-Y in FIG. 1B.

FIG. 1A is a perspective view showing the multi-layer piezoelectric element according to a first embodiment of the present invention, FIG. 1B is a sectional view taken along lines X-X in FIG. 1A and FIG. 1C is a sectional view taken along lines Y-Y in FIG. 1B.

As shown in FIGS. 1A-1C, the multi-layer piezoelectric element 1 according to the first embodiment of the present invention (hereinafter also referred to as "element 1") comprises a stacked body 7, which is formed by stacking a plurality of piezoelectric layers 3 and a plurality of internal electrode layers 5 alternately one on another, and external electrodes 9 formed on the side faces of the stacked body 7.

In the present embodiment 1, on the side face where the external electrode 9 is formed, the external electrode 9 is electrically connected to the plurality of internal electrode layers 5 in every other layer, and each end of the internal electrode 5, which is not electrically connected to the external electrode 9 on the side face, is located away from the side face (FIGS. 1A and 1B).

Figure 2A:
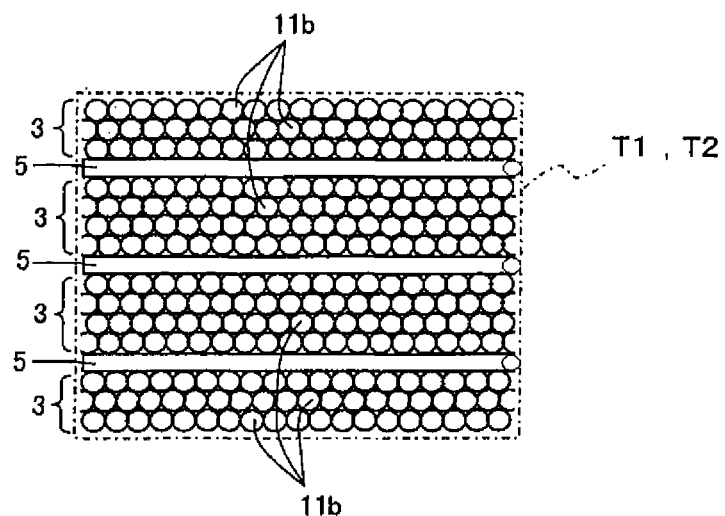
FIG. 2A is an enlarged schematical sectional view showing Region T1 in FIG. 1B and Region T2 in FIG. 1C.
Figure 2B:
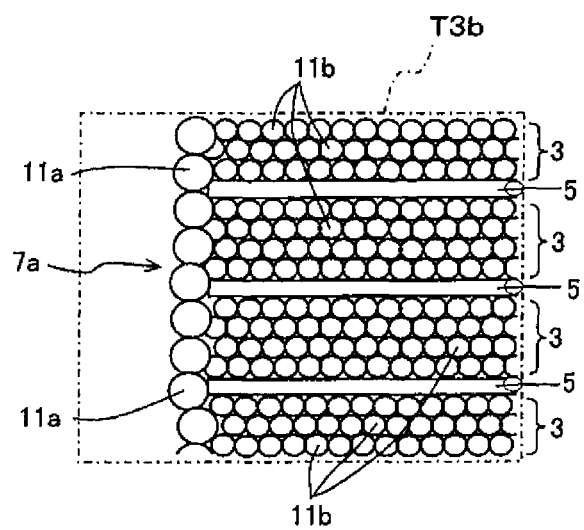
FIG. 2B is an enlarged schematical sectional view showing Region T3 in FIG. 1C.

FIG. 2A is an enlarged schematical sectional view showing Region T1 in FIG. 1B and Region T2 in FIG. 1C, FIG. 2B is an enlarged schematical sectional view showing Region T3 in FIG. 1C, and FIG. 2C is an enlarged schematical sectional view showing Region T3a in FIG. 1B.

As shown in FIGS. 2A, 2B and 2C, each of the piezoelectric layers 3 is constituted of a plurality of piezoelectric crystal grains 11 (11a, 11b). In the element 1 according to the present embodiment, the average grain size Ga of the piezoelectric crystal grains 11a in the side face 7a of the stacked body 7 is larger than the average grain size Gb of the piezoelectric crystal grains 11b in a region of the piezoelectric layer 3, in which region the piezoelectric layer 3 is sandwiched between the adjacent and opposing internal electrode 5 in the stacking direction (i.e. the region which is driven by applying a voltage: driven region). Since the piezoelectric crystal grains 11a having a larger average grain size are located along the side face 7a of the stacked body 7 where stress tends to concentrate, the stress relaxation effect adjacent to the side face 7a is improved.

In addition, in the present embodiment, the piezoelectric crystal grains 11a having a larger average grain size are located at each of the four all sides faces 7a of the stacked body 7 as shown in FIGS. 2A, 2B and 2C. Since each of the four side faces of the stacked body surrounding the driven region possesses the stress relaxation effect, it makes possible to effectively absorb the stress generated therein by the deformation of each of the four side faces which follows the expansion and contraction of the driven region.

That is, when voltage is applied across the piezoelectric element 1, the piezoelectric layer sandwiched by the adjacent and opposing layers of the internal electrode 5 in the stacking direction begins to expand and contract. On the other hand, the region, where the adjacent internal electrodes 5 do not oppose each other in the stacking direction, that is, the region near the side faces of the element 1, is never driven voluntarily. Accordingly, when the voltage is applied to the element 1, the stress becomes more likely to concentrate in the region adjacent to the side face of the element. In the multi-layer piezoelectric element according to a first embodiment of the present invention, the stress relaxation effect in the side faces is improved by locating the piezoelectric crystal grains having a larger average grain size in the side faces where the stress tends to be concentrated. One reason why such stress relaxation effect is obtained is derived from the property of the piezoelectric crystal grains that a grain can easily deform as the size thereof is larger.

Thus, the multi-layer piezoelectric element according to the present first embodiment can provide a multi-layer piezoelectric element which exhibits excellent durability along with suppressing breakage, even when it is driven continuously for a long time under high electric field and high pressure.

In the above embodiment 1, the piezoelectric crystal grains 11a having a larger average grain size are located at each of the four side faces 7a of the stacked body 7 as a preferable embodiment, however the present invention is not limited to such an embodiment. For example, the piezoelectric crystal grains 11a having a larger average grain size may be located at two opposing side faces or two adjacent side faces of the stacked body, or alternatively may be located at only one side face of the stacked body in the present invention.

The average grain sizes Ga, Gb of the piezoelectric crystal grains 11a may be measured according to the determining method as follows. The average grain size Ga of the piezoelectric crystal grains 11a in the side face 7a of the stacked body 7 is determined by drawing arbitrary five straight lines on an image of a surface of a side face 7a, which image has been observed from a scanning electron microscope (SEM) or a metallographic microscope, and calculating the average value of two hundreds of crystal grains over which the five straight lines are crossing. The average grain size Gb of the piezoelectric crystal grains 11b in the region, which is sandwiched between the adjacent and opposing layers of the internal electrode 5 in the stacking direction can be determined by exposing the surface of the section (i.e. the section parallel to the stacking direction of the stacked body) of the region where the average grain size is intended to be determined, by polishing treatment and so forth, thereafter subjecting to the above determining method. In place of the Code method as explained in the above, the average grain size may be determined by using an image analyzing apparatus LUZEX-FS (obtainable from Nireco Co., Tokyo, Japan).

It is preferable that the average grain size Ga of the piezoelectric crystal grains 11a in the side face 7a of the stacked body 7 is in a range from 1.1 to 3 times, preferably from 1.2 to 2 times of the average grain size Gb of the piezoelectric crystal grains 11b in the region where the layers of the internal electrode 5 are opposing each other in the stacking direction. When the average grain size Ga is larger than 3 times of Gb, the grain comes to effectively absorb the stress even if the stress is larger. However, on the other hand, it comes to easily form cracks in the grains, which may divide the crystalline grains when the grains themselves deform due to the stress, thereby cracks may easily grow in the stacked body. When the average grain size Ga is smaller than 1.1 times of Gb, the stress relaxation effect adjacent to the side faces 7a of the element may not be obtained sufficiently. As to the average grain size Gb of the piezoelectric crystal grains 11b, it is preferably in a range from 0.5 to 5 µm, since the grains having the size in such range afford to obtain both an excellent driven deforming capacity under application of an electric field and a strength which formation of cracks within the crystalline grains is suppressed when the stress is generated therein after the crystalline grains were subjected to the driven deforming under application of an electric field.

It is preferable that the contents of the metal existing in the grain boundary of the piezoelectric crystal grains 11a in the side face 7a of the stacked body 7 is larger than the contents of the metal existing in the grain boundary of the piezoelectric crystal grains 11b in the region, which is sandwiched between the adjacent and opposing layers of the internal electrode 5 in the stacking direction. Thus, the metal existing in the grain boundary between the piezoelectric crystal grains can absorb the stress by deforming itself, so that the stress relaxation effect is improved as the content thereof is increased. Accordingly, the durability of the multi-layer piezoelectric element can be further improved when the contents of the metal existing in the grain boundary adjacent to the side faces 7a of the element where the stress tends to be concentrated are higher than the other parts. The metals which can be contained in the crystal grains include such as Ag, Au, Pd, Pt and an alloy of any of such metals.

The contents of the metals existing in the grain boundary may be measured according to the method as follows. That is, the kinds, location, size of the metal can be determined by an elemental analysis using electron probe micro analysis (EPMA). In addition, the contents of the metal can be calculated by subjecting the obtained image to the image analysis.

<Method for Manufacturing>

The method for manufacturing the multi-layer piezoelectric element according to the above embodiment will be explained. A calcined powder of a piezoelectric ceramic material constituted from a perovskite type oxide such as lead zirconate titanate ($PbZrO-PbTiO_3$), a binder made of an organic polymer such as acrylic resin or butyral resin and a plasticizer such as DBP (dibutyl phthalate) or DOP (dioctyl phthalate) are mixed to form a slurry. Then the slurry is formed into ceramic green sheets that would form the piezoelectric layer 3 by a known method such as a doctor blade process or a calender roll process or another tape molding method.

Then, a metal powder such as a silver-palladium alloy, a binder and a plasticizer are mixed to prepare an electrically conductive paste that would form the internal electrode layer 5. Then, it is applied onto the top surfaces of the above green sheets by a screen printing method or the like to a thickness, for example, from 1 to 40 µm.

Then a plurality of the green sheets having the electrically conductive paste printed thereon are stacked one on another in a predetermined arrangement to obtain a stack. The stack is then subjected to a binder removal treatment at a predetermined temperature and then fired in a range from 900 to 1,200° C. thereby a stacked body is obtained.

In order to make the average grain size Ga of the piezoelectric crystal grains 11a in the side face 7a of the stacked body 7 larger than the average grain size Gb of the piezoelectric crystal grains 11b in the region where the layers of the internal electrode 5 are opposing each other in the stacking direction, the method as follows may be applicable. First, after a plurality of the green sheets are stacked one on another to obtain a stacked body and before the stacked body is subjected to a binder removal treatment, a paste consisting of a metal powder such as a silver powder or a silver-alloy powder, to which a binder and a plasticizer are added and mixed, is printed in a thin layer onto a part or whole of the surface, where the grain size is intended to be enlarged, in the side face of the stacked body. Then, the stacked body is subjected to the binder removal treatment at a predetermined temperature and then fired in a range from 900 to 1,200° C., thereby the stacked body according to the present embodiment 1, in which the piezoelectric crystal grains 11a having a larger average grain size are located in the side face 7a, can be obtained. Alternatively, the stacked body according to the present embodiment 1 can be produced from a relatively simple method that a blade in a form of a saw blade is used when the stacked body formed by stacking a plurality of green sheets is cut into a desired size. Compared with the case where a cutter or a dicing blade in the form of rotary disc form is used in the cutting, the above method facilitates not only to cut at a high speed, but also to roughen the surface cut by the saw blade, which surface corresponds to the side face 7a of the stacked body 7. Thereby, the conductive paste which was printed on the end of the metal layer 5 in the side face 7a of the stacked body 7 can be coated on the end of the piezoelectric layers 3. That is, the cutting using a cutter or using a dicing blade in the form of rotary disc form, which are conventionally and widely used, is a technique where the cut surface is flattened without being roughened as much as possible when the stacked body is cut into a desired size. Thus, the metal layer 5 can be clearly distinguished from the piezoelectric layer 3 in the cut surface (side face 7a), so that the border therebetween is clearly distinguished. In addition, these conventional cutting methods substantially eliminate the forming of the shavings of the electrode (according to the cutting using a cutter) or perform the cutting with removing the shavings of the electrode that have once formed from the cut surface (according to the dicing blade in the form of rotary disc form, where the cut surface is polished by the side face of the blade so that the shavings of the electrode do not adhere to the cut surface). To the contrary, for example, by cutting with the blade in the form of the saw blade, the shavings of the electrode that form during the cutting are diffused over the surface of the piezoelectric layer 3 which exposes to the cut surface and adhered thereto without removing from the cut surface. Then, the stacked body having an exposed cut surface of the piezoelectric layer 3, where the shavings of the electrode adheres, is subjected to a binder removal treatment at a predetermined temperature, followed by being fired in a range from 900 to 1,200° C., the stacked body according to the present embodiment 1, in which the piezoelectric crystal grains 11a having a larger average grain size are located in the side face 7a, can be obtained. There are several blade forms in the saw blades including such as a blade edge having a plurality of teeth arranged in a single row, a blade edge having a plurality of teeth arranged in alternately staggered double rows, and a blade edge having a plurality of teeth arranged in a single row but the height and the width of the teeth are alternately changed and so on. In the present embodiment, using a plurality of a blade edge such as the blade edge having a plurality of teeth arranged in alternately staggered double rows or the blade edge having a plurality of teeth arranged in a single row but the height and the width of the teeth are alternately changed, the conductive paste printed on the end of the metal layer 5 in the side face 7a of the stacked body 7 can be coated on the end of the piezoelectric layers 3, while keeping the smoothness of the cut surface of the stacked body. On the other hand, when the blade edge having a plurality of teeth arranged in a single row is used, it is possible to cut in a linear fashion at a high speed with roughening the cut surface, so that it facilitates to improve the mass productivity. When the stacked body keeping the cut surface roughened is fired, sintering of the stacked body aggressively advances, thereby the cut surface comes to be smoothed due to the effect that the conductive paste has been coated. In addition, in the case where the element after fired is cut or polished in order to equalize the shape and the size of the elements, the stress caused by the cutting or the polishing can be relaxed due to the presence of large grains on the surface of the element. Thus, it is possible to produce a piezoelectric element having an improved durability with eliminating the residual stress due to the treatment or the formation of cracks on the surface of the treated surface.

That is, the piezoelectric ceramic material constituted from a perovskite type oxide such as $PbZrO_3$—$PbTiO_3$ is facilitated to be sintered upon firing by locating a metal such as silver adjacent to it. Thereby the grain growth of the piezoelectric crystalline grains is facilitated. In addition, the piezoelectric crystalline grains, which form the side faces of the stacked body, has a difference in that the parts exposing at the side faces is not constrained, from the piezoelectric crystalline grains residing in the stacked body. Thus, the firing at the side faces is facilitated rather than at the other parts of the stacked body and the grain sizes can be enlarged by printing the electrically conductive paste containing the metal powders as described in the above at the side faces of the stacked body. Thus, the stacked body according to the embodiment 1 can be easily produced, since the stacked body, in which the piezoelectric crystal grains 11a having a larger average grain size are located in a part or whole of the side face 7a thereof, can be obtained by the relatively simple method comprising printing the paste containing the metal powder in a thin layer and firing it.

The metal components such as Ag in the paste which was printed onto the side faces of the stacked body before firing are changed into oxide components such as AgO when the stacked body is subjected to the firing, followed by changed into a liquid component of the piezoelectric body. Thus, the metal components, after contributing to the grain growth of the piezoelectric crystalline grains, are absorbed into the internal electrode at the region adjacent to the internal electrode and precipitate as the component of oxide glass in the grain boundary between the piezoelectric crystal grains at the surface of the stacked body. Since no metal grain precipitates on the surface of the stacked body, formation of the short circuit between electrodes having opposing polarities is suppressed even if the external electrodes are formed after the firing. In addition, when the external electrodes are printed and fired, the external electrodes firmly bond to the stacked body by the glass component contained in the paste for the external electrode. In such case, the metal component contained in the external electrode easily diffuses within the glass component, which is molten and softened under high temperature condition during the firing, so that the metal component easily bonds to the internal electrodes. In the cooling step after the firing, the metal grains are sintered from the end of the internal electrodes before the glass completes its solidification, so that the internal electrodes and the external electrodes can be electrically bonded, even if there is a piezoelectric body in which grains on the surface of the stacked body become enormous. Further, when the paste for the external electrode contains an element which constitutes the piezoelectric body, the sizes of the piezoelectric grains on the surface of the stacked body come to further increased, so that the stress relaxation effect is further improved.

It is preferable that the thickness of the paste being printed on the side faces is from 1 to 30 μm in the dried thickness after the printing. When the printing thickness is equal to or over 1 μm, the sintering facilitating effect of the piezoelectric ceramics is sufficiently obtained. In addition, when the printing thickness is equal to or less than 30 μm, decreasing of the insulation between the internal electrodes having opposing polarities which expose at the side faces of the stacked body can be suppressed. That is, a part or whole of the metal in the paste, which was printed on the side faces, diffuse into the stacked body due to the firing and the amount of the metal residing in the side face of the stacked body can be adjusted, so that the insulation between the internal electrodes having opposing polarities can be maintained due to having the printing thickness equal to or less than 30 μm. In the case where the internal electrodes do not expose at the side faces of the stacked body, the printing thickness may be larger than 30 μm.

Then, a silver-glass electroconductive paste is produced by adding a binder to a silver powder and glass powder, and the paste is printed on the surface where the external electrode of the stacked body is intended to be formed (opposing two side faces 7a), and then baked at a temperature from 500 to 800° C. Thereby, the external electrodes 15 can be formed, by using the silver-glass conductive paste.

Finally, lead wires are connected to the external electrodes 15, and a DC voltage of 0.1 to 3 kV/mm is applied across the pair of external electrodes 15 via the lead wires so as to apply a polarization treatment to the stacked body 13, thereby the multi-layer piezoelectric element is obtained. The lead wires are connected to an external voltage source that supplies the voltage via the lead wires and the external electrodes 15 to the metal layer 12, so that the piezoelectric layers 11 undergo significant displacement due to a reverse piezoelectric effect. Thus the device functions as, for example, an automobile fuel ejection valve that ejects fuel to an engine.

When the surface of the multi-layer piezoelectric element is further coated with a resin such as a silicone resin, a slit of the separated electrodes 16 where the slit is opened on the element surface may be filled with the resins.

Embodiment 2

Figure 3A:
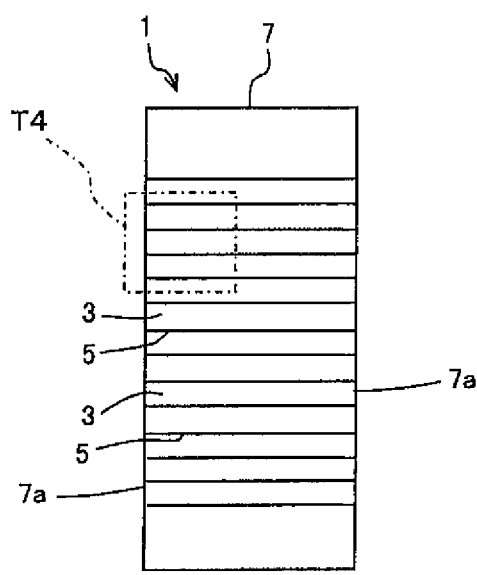
FIG. 3A is a sectional view showing the multi-layer piezoelectric element according to a second embodiment of the present invention.
Figure 3B:
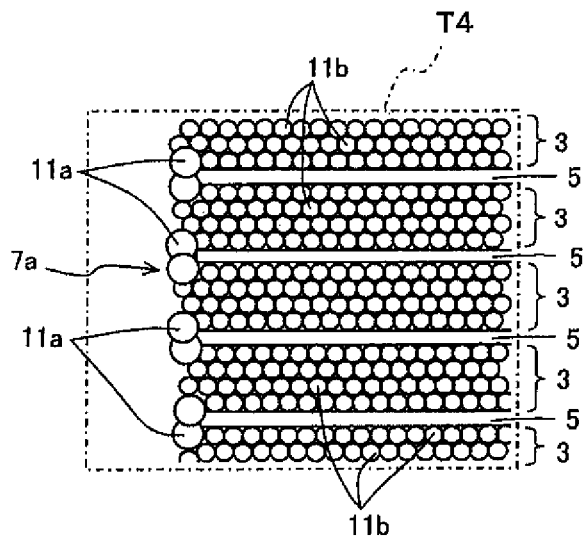
FIG. 3B is an enlarged schematical sectional view showing Region T4 in FIG. 3A.

FIG. 3A is a sectional view showing the multi-layer piezoelectric element according to another embodiment of the present invention, and FIG. 3B is an enlarged schematical sectional view showing Region T4 in FIG. 3A. That is, the grain size of the piezoelectric crystal grains 11a across whole of the side face 7a was made larger in the above embodiment 1. To the contrary, the grain size of the piezoelectric crystal grains 11a is partially made larger in the multi-layer piezoelectric element of the present embodiment 2. Specifically, in the multi-layer piezoelectric element of the present embodiment 2, the average grain size Ga of the piezoelectric crystal grains 11a at the part located lateral to the internal electrode layer 5 within the side face of the stacked body is selectively made larger than the average grain size Gb of the piezoelectric crystal grains 11b at the part located where the internal electrode layers 5 are adjacent and opposing in the stacking direction, as shown in FIGS. 3A and 3B. Since stress tends to be particularly concentrated into the part located lateral to the internal electrode layer 5 within the side face 7a of the stacked body 7 when the element is driven, the stress relaxation effect can be selectively imparted by adopting the construction as described in the above. In order to make the grain size selectively larger as shown in FIGS. 3A and 3B, a paste containing a metal which facilitates the sintering of the piezoelectric body may be printed onto the part located lateral to the internal electrode layer 5 within the side face 7a of the stacked body 7, followed by fired in the method for manufacturing explained in the embodiment 1.

Embodiment 3

Figure 4A:
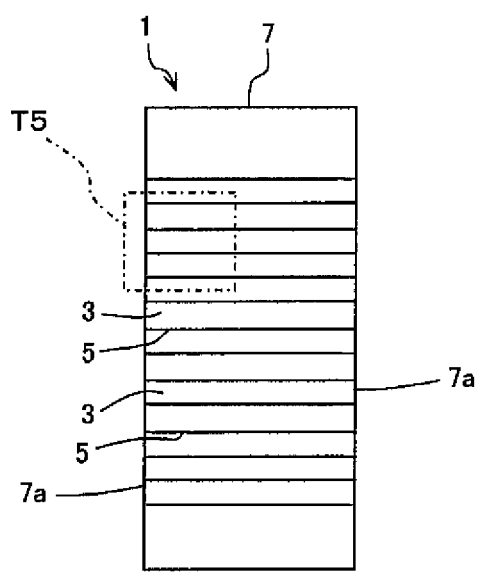
FIG. 4A is a sectional view showing the multi-layer piezoelectric element according to a third embodiment of the present invention.
Figure 4B:
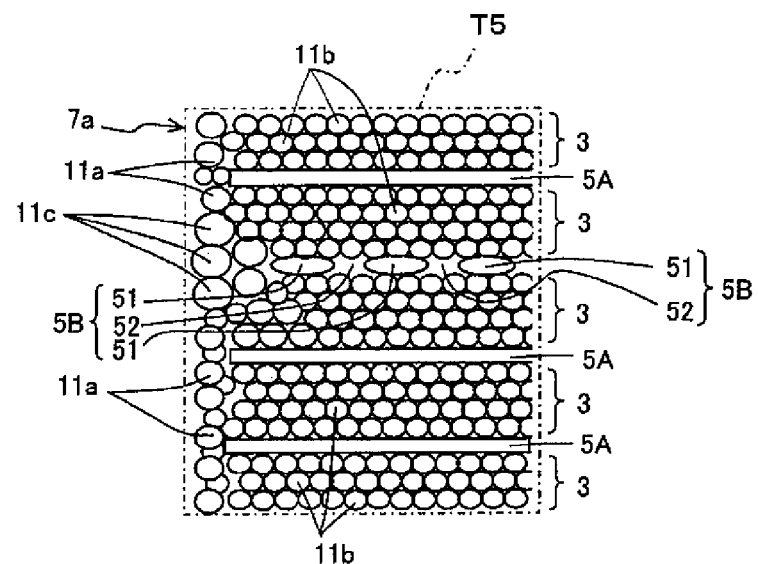
FIG. 4B is an enlarged schematical sectional view showing Region T5 in FIG. 4A.

FIG. 4A is a sectional view showing the multi-layer piezoelectric element according to a third embodiment of the present invention, and FIG. 4B is an enlarged schematical sectional view showing Region T5 in FIG. 4A. As shown in FIGS. 4A and 4B, the piezoelectric element in the present embodiment 3 comprises, as at least one of the plurality of the metal layers, a low-rigidity metal layer 5B, which has a rigidity lower than those of the piezoelectric layer 3 and the internal electrode layer 5. That is, in the embodiment 3, a plurality of metal layers comprise the inner electrode layer 5 which are electrically connected to the external electrode and the low-rigidity metal layer 5B which has a rigidity lower than those of the piezoelectric layer 3 and the internal electrode layer 5 and which comprises a plurality of metal parts 51 located apart from each other via voids 52. In the side face 7a of the stacked body 7, the average grain size Gc of the piezoelectric crystal grains 11c at the part located lateral to the low-rigidity metal layer 5B is larger than the average grain size Gb of the piezoelectric crystal grains 11b at the part located where the internal electrode layers 5 are opposing in the stacking direction (Gc>Gb). In addition, the average grain size Gc of the piezoelectric crystal grains 11c in the embodiment 3 is larger than the average grain size Ga of the piezoelectric crystal grains 11a at the part located lateral to the internal electrode layer 5 (Gc>Ga).

Having the structure as shown in FIGS. 4A and 4B, it is possible to impart an excellent durability to the piezoelectric element by a synergistic effect of the stress relaxation effect caused by the low-rigidity metal layer 5B as described below and the stress relaxation effect caused by the side face 7a of the stacked body 7.

The part where the low-rigidity metal layer 5B being formed, may be formed by printing a conductive paste, which was prepared by mixing a metal powder such as Ag—Pd which forms the metal layer 12 with a binder and a plasticizer and so forth, followed by printing the paste prepared by mixing resin beads such as acrylic beads in a predetermined thickness. In the part where the paste containing the resin beads such as acrylic beads was printed, the acrylic beads are burnt down by the firing. Thus, the low-rigidity metal layer as described in the above may be formed. Since the low-rigidity metal layer has a rigidity lower than those of the other metal layers, the low-rigidity metal layer breaks down by itself when the element is driven, thereby the low-rigidity metal layer serves a function to absorb the stress. As a result, the formation of the cracks in the internal electrode layer 5A and the piezoelectric layer 3 can be surely suppressed.

In order to selectively enlarge the grain sizes as shown in FIGS. 4A and 4E, a piezoelectric element may be produced by using the resin beads as described in the above and printing the paste containing the metal as described in the above embodiment 1 onto the side face 7a of the element, followed by firing. Accordingly, the average grain size Ga of the piezoelectric crystal grains 11a in the side face 7a of the element 1 can be enlarged than the average grain size Gb of the piezoelectric crystal grains 11b in the region which is sandwiched between the adjacent and opposing layers of the internal electrode 5 in the stacking direction. In addition, the low-rigidity metal layer 5B has many voids 52. Thus, due to the combination of the action of the metal such as silver contained in the paste and the action of the voids 52, the piezoelectric crystal grains 11c which are located lateral to the low-rigidity metal layer 5B comes to have a larger average grain size than the piezoelectric crystal grains 11a.

Each rigidity of the low-rigidity metal layer 5B, the piezoelectric layer 3 and the internal electrode layers 5 can be easily compared by, for example, applying load to the element in the direction perpendicular to the stacked direction. Specifically, it may be determined by applying load to the element in the direction perpendicular to the stacked direction according to the JIS three-point bending test (JIS R 1601). When the above test is performed, it is confirmed which part in the element 1 breaks. The broken part is the part having the lowest rigidity in the element.

Since the multi-layer piezoelectric element 1 of the present embodiment 3 comprises the low-rigidity metal layer 5B, the break preferentially occurs in the low-rigidity metal layer 5B and at the interfaces between the low-rigidity metal layer 5B and the piezoelectric layer 3 rather than in the piezoelectric layer 3 and the internal electrode layer 5A. Thus, the evaluation can be performed by the result whether the break occurred in the piezoelectric layer 3 or the internal electrode layer 5A or in the low-rigidity metal layer 5B or at the interfaces between the low-rigidity metal layer 5B and the piezoelectric layer 3.

In addition, it is sufficient to confirm at which part the break occurred in the above test. Thus, when the above JIS three-point bending test cannot be applied due to a test specimen size being too small, the evaluation can be performed by preparing a test specimen having a rectangular column form from the element, placing the test specimen on two supporting points located apart at a predetermined distance and applying load to a midpoint between the two supporting points.

In addition, the phrase "having low rigidity" may be interpreted by the phrase having low Young's modulus. The Young's modulus can be determined, for example, by the nanoindentation method. For example, "Nanoindenter II" (available from Nano Insturment Inc.) can be used as the measuring apparatus. In a section perpendicular to or parallel to the stacked direction of the stacked body 7, the low-rigidity metal layer 5B, the piezoelectric layer 3 or the internal electrode layer 5A is exposed and Young's modulus may be measured using the above measuring apparatus.

Although the condition of the piezoelectric crystal grains in the side face where the external electrode is not formed is explained in the above embodiments 2 and 3, it is preferable in the present invention to locate the piezoelectric crystal grains 11a having the large average grain size to each of four side faces 7a. However, the present invention is not limited to those embodiments described above, but may be applied to the other embodiments wherein the piezoelectric crystal grains 11a having the large average grain size are located to the opposing two side faces or to the adjacent two side faces or the piezoelectric crystal grains 11a having the large average grain size are located to only one side face.

Figure 5:
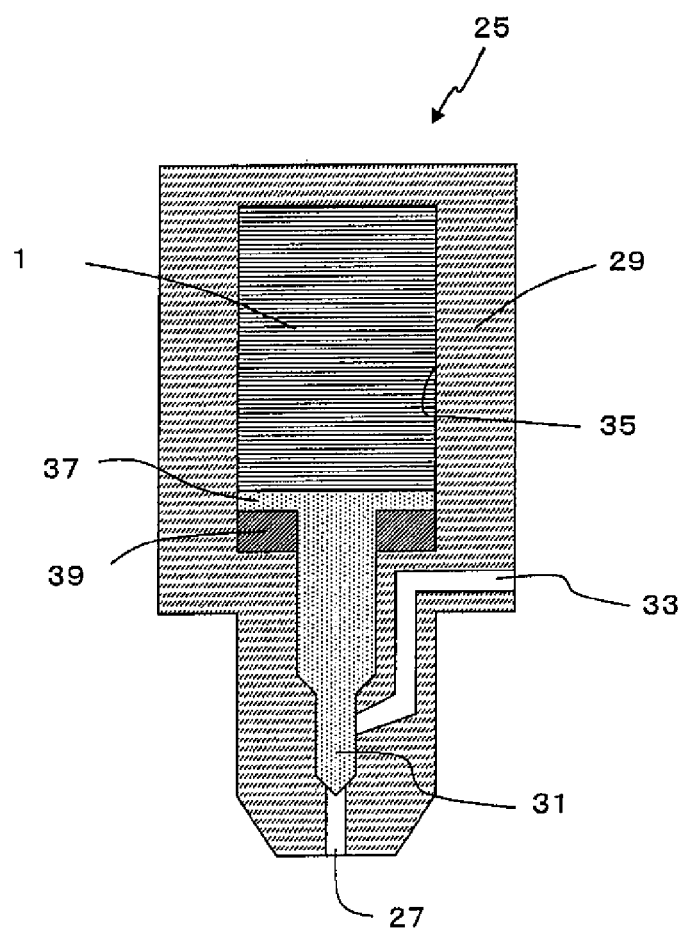
FIG. 5 is a sectional view showing the ejection apparatus according to an embodiment of the present invention.

Next, as to an ejection apparatus 25 in an embodiment of the present invention is explained. FIG. 5 is a sectional view showing the ejection apparatus 25 according to an embodiment of the present invention. As shown in FIG. 5, the multi-layer piezoelectric element 1 represented by the above embodiment is accommodated in a storage container 29 which has an ejection hole 27 on an end of the ejection apparatus 25 according to an embodiment of the present invention. A needle valve 31 that can open and close the ejection hole 27 is housed in the container 29. The ejection hole 27 is connected to a fuel passage 33 disposed so as to be capable of making communication with the movement of the needle valve 31. The fuel passage 33 is connected to a fuel source that is provided outside of the apparatus, so as to receive supply of the fuel at a high pressure that remains always constant. When the needle valve 31 opens the ejection hole 27, the fuel that fills the fuel passage 33 is ejected at a predetermined level of high pressure into a fuel chamber of an internal combustion engine that is not shown in the drawings.

The needle valve 31 has an enlarged top portion of a larger diameter so as to provide a piston 37 that makes a sliding motion in a cylinder 35 that is formed in the container 29. The piezoelectric element 1 described above is housed in the container 29.

With the ejection apparatus 25 as described above, when the piezoelectric element 1 is, caused to expand by a voltage applied thereto, the piston 37 is pressed so that the needle valve 31 plugs the ejection hole 27 and shuts off the fuel supply. When the voltage is removed, the piezoelectric element 1 contracts and a Belleville spring 39 presses back the piston 37 so that the ejection hole 27 communicates with the fuel passage 33 thereby allowing the fuel to be ejected.

Moreover, the ejection apparatus 25 of the present embodiment may be constituted so that it comprises a container having an ejection hole 27 and the multi-layer piezoelectric element 1, wherein a liquid filled in the container is ejected through the ejection hole 27 by the operation of the multi-layer piezoelectric element 1. That is, the multi-layer piezoelectric element 1 is not necessarily be located in the container, but is sufficient that the apparatus has a constitution that a pressure may be generated within the container by the drive of the multi-layer piezoelectric element 1. In addition, in the present embodiment, the term liquid includes a fuel, an ink and various fluids in the form of liquid such as a conductive paste.

Then, a fuel ejection system 41 according to an embodiment of the present invention is explained.

Figure 6:
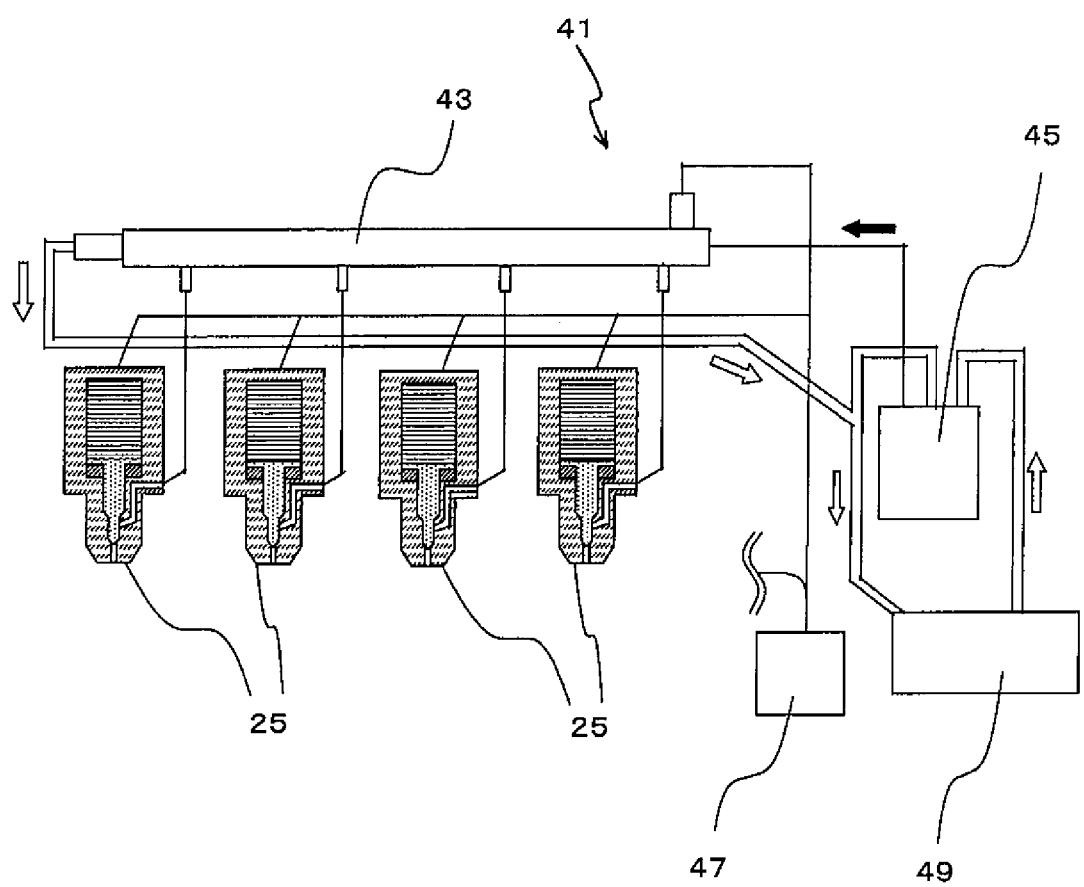
FIG. 6 is a schematic view showing the fuel ejection system according to an embodiment of the present invention.

FIG. 6 is a schematic view showing the fuel ejection system according to an embodiment of the present invention. As shown in FIG. 6, the ejection system 41 of the present invention comprises a common rail 43 that contains a fuel stored at a high pressure, a plurality of ejection apparatus 25 as described in the above which can eject the fuel stored in the common rail 43, a pump 45 which supplies the fuel to the common rail 43 at a high pressure and an ejection control unit 47 that supplies a drive signal to the ejection apparatus 53.

The ejection control unit 47 controls the quantity of fuel ejected and the timing of ejection, while monitoring the condition in the engine with a sensor. The pump 45 supplies the fuel from the fuel tank 49 to the common rail 43 by boosting the pressure to about 1,000 to 2,000 atm, preferably from 1,500 to 1,700 atm. The common rail 43 stores the fuel sent by the pump 45 and sends it to the ejection apparatus 25 as required. The ejection apparatus 25 ejects a small amount of fuel by spraying through the ejection hole 27.

The present invention is not limited to the embodiments described above. Various modifications may be made to the present invention without departing from its scope.

A piezoelectric actuator comprising the piezoelectric element 1 of the present invention was fabricated according to the procedure as follows. First, a calcined powder of a piezoelectric ceramic material constituted from lead zirconate titanate ($PbZrO_3$—$PbTiO_3$) having an average grain size of 0.4 µm as the main component, a binder and a plasticizer were mixed to form a slurry, which was formed into ceramic green sheets that would become the piezoelectric layer 3 having a thickness of about 150 µm by a doctor blade process.

An electrically conductive paste to form the metal layer 5 including such as the internal electrode 5A, prepared by adding a binder to a silver-palladium alloy (95% by weight of silver and 5% by weight of palladium), was applied to one side of the ceramic green sheet by a screen printing method. Then 300 pieces of the ceramic green sheets were stacked.

Then, a saw-type blade was attached in place of a rotary disc form blade on a dicing saw machine and the stacked ceramic green sheets were cut so as to obtain the desired size of the element 1. At the cut surface of the ceramic green sheets after cutting, the metal layers 5 including such as the internal electrode 5A to which the electrically conductive paste was printed are exposed.

At this time, a blade edge having a plurality of teeth arranged in a single row was used for Sample No. 1, a blade edge having a plurality of teeth arranged in alternately staggered double rows was used for Sample No. 2, and a blade edge having a plurality of teeth arranged in a single row but the height and the width of the teeth are alternately changed was used for Sample No. 3. As to Sample No. 4, a rotary disc, form blade comprising an aggregate of diamond grains was used for its cutting, thereafter a paste which was formed by adding a binder to a silver powder was printed in a thickness of 10 µm.

Thereafter, each of the stacks after cutting was dried and fired. The firing was performed by holding the stacks at a temperature of 800° C. for 90 minutes, followed by firing at a temperature of 1,000° C. for 200 minutes.

To a mixture of silver powder in a flake form having an average grain size of 2 µm and glass powder having a softening point of 640° C. including silicon having an average grain size of 2 µm as the main component, 8 parts by weight of binder, based on 100 parts in total of the weights of the silver powder and the glass powder, were added and sufficiently mixed so as to prepare the electrically conductive silver-glass paste. The electrically conductive silver-glass paste thus prepared was screen printed onto a release film. After drying, the paste film was peeled off to obtain a sheet of electrically conductive silver-glass paste.

Then, the sheet of electrically conductive silver-glass paste was transferred to an external electrode forming surface of the stacked body and stacked, and then fired at a temperature of 700° C. for 30 minutes thereby an external electrode was formed.

Then lead wires were connected to the external electrodes 5, and a DC electric field of 3 kV/mm was applied between the external electrodes 5 of positive and negative polarities via the lead wires so as to apply a polarization treatment for 15 minutes, thereby a piezoelectric actuator using the multi-layer piezoelectric element is fabricated.

When a DC voltage of 170 V was applied to the multi-layer piezoelectric element obtained as described above, an amount of displacement in the stacking direction was obtained in all of the multi-layer piezoelectric actuators.

Then, this multi-layer piezoelectric actuator was subjected to a continuous drive test by applying an AC voltage varying between 0 V and +170 V at frequency of 150 Hz at room temperature for $1 \times 10^9$ cycles. Results of the drive test are shown in Table 1.

TABLE 1

| Sample No. | Saw blade | Ag print onto cut surface | initial displacement | displacement after driven for $1 \times 10^9$ cycles | Crack |
|---|---|---|---|---|---|
| 1 | single row blade edge | none | 57 | 50 | none |

TABLE 1-continued

| Sample No. | Saw blade | Ag print onto cut surface | initial displacement | displacement after driven for $1 \times 10^9$ cycles | Crack |
|---|---|---|---|---|---|
| 2 | double row blade edge (alternately staggered) | none | 57 | 56 | none |
| 3 | double row blade edge (alternately changed blade edge) | none | 57 | 57 | none |
| 4 | double row blade edge (alternately changed blade edge) | 10 μm | 57 | 57 | none |

As can be seen from Table 1, it has been demonstrated that each of samples Nos. 1, 2, 3 and 4 that are Examples of the present invention is the multi-layer piezoelectric element, which satisfies the continuous drive test performed for $1 \times 10^9$ cycles, shows no delamination between the layers and no formation of cracks, shows no extreme degradation in the displacement from its initial value, retains an effective displacement which is necessary at a multi-layer piezoelectric element and shows an excellent durability which inhibits malfunction.

Above all, each multi-layer piezoelectric element of samples Nos. 3 and 4 has been found to be a multi-layer piezoelectric element having a stable element displacement, since it maintains the effective displacement from the initial period shows not change in the properties of the element after the continuous drive test and shows the excellent durability.

The invention claimed is:

1. A multi-layer piezoelectric element comprising a stacked body in which a plurality of piezoelectric layers and a plurality of metal layers are stacked alternately one on another,
    wherein the piezoelectric material layer comprises a plurality of piezoelectric crystal grains,
        wherein an average grain size of the piezoelectric crystal grains in a side face of the stacked body is larger than an average grain size of the piezoelectric crystal grains in a region of the piezoelectric layer, in which region the piezoelectric layer is sandwiched between the adjacent and opposing internal electrode in the stacking direction.

2. The multi-layer piezoelectric element according to claim 1, wherein the average grain size of the piezoelectric crystal grains in at least opposing pair of side faces of the stacked body is larger than the average grain size of the piezoelectric crystal grains in a region of the piezoelectric layer, in which region the piezoelectric layer is sandwiched between the adjacent and opposing internal electrode in the stacking direction.

3. The multi-layer piezoelectric element according to claim 1, wherein the average grain size of the piezoelectric crystal grains in the four all sides faces of the stacked body is larger than the average grain size of the piezoelectric crystal grains in a region of the piezoelectric layer, in which region the piezoelectric layer is sandwiched between the adjacent and opposing internal electrode in the stacking direction.

4. The multi-layer piezoelectric element according to claim 1, wherein the average grain size of the piezoelectric crystal grains in the side faces of the stacked body is in a range from 1.1 to 3 times of the average grain size of the piezoelectric crystal grains in a region of the piezoelectric layer, in which region the piezoelectric layer is sandwiched between the adjacent and opposing internal electrode in the stacking direction.

5. The multi-layer piezoelectric element according to claim 1, wherein the average grain size of the piezoelectric crystal grains in a region of the piezoelectric layer, in which region the piezoelectric layer is sandwiched between the adjacent and opposing internal electrode in the stacking direction, is in a range from 0.5 to 5 μm.

6. The multi-layer piezoelectric element according to claim 1, wherein the average grain size of the piezoelectric crystal grains at the part located lateral to the metal layer in the side face is larger than the average grain size of the piezoelectric crystal grains in a region of the piezoelectric layer, in which region the piezoelectric layer is sandwiched between the adjacent and opposing internal electrode in the stacking direction.

7. The multi-layer piezoelectric element according to claim 1,
    wherein further comprising an external electrode formed on the side face of the stacked body,
    wherein the plurality of metal layers comprise at least one of internal electrode layer which is electrically connected to the external electrode and at least one low-rigidity metal layer which comprises a plurality of metal parts located apart from each other and which has rigidity lower than those of the piezoelectric layer and the internal electrode layer, and
    wherein, an average grain size of the piezoelectric crystal grains at the part located lateral to the low-rigidity metal layer is larger than an average grain size of the piezoelectric crystal grains in the piezoelectric layer at the part located lateral to the internal electrode layer in the side face.

8. The multi-layer piezoelectric element according to claim 1, wherein the contents of the metal existing in a grain boundary of the piezoelectric crystal grains in the side face is larger than the contents of the metal existing in a grain boundary of the piezoelectric crystal grains in a region of the piezoelectric layer, in which region the piezoelectric layer is sandwiched between the adjacent and opposing internal electrode in the stacking direction.

9. The multi-layer piezoelectric element according to claim 8, wherein the metal existing in the grain boundary of the piezoelectric crystal grains comprises Ag, Au, Pd, Pt and an alloy of any of such metals.

10. An ejection apparatus comprising:
    a container comprising an ejection hole; and
    the multi-layer piezoelectric element according to one of claims 1 to 9 housed in the container,
    wherein liquid is ejected through the ejection hole by the drive of the multi-layer piezoelectric element.

11. A ejection system comprising
    a common rail for storing a fuel at a high pressure;
    an ejection apparatus according to claim 10 for discharging the fuel stored in the common rail;
    a pump for supplying the fuel at a high pressure to the common rail; and
    an ejection control unit that supplies a drive signal to the ejection apparatus.

* * * * *